(12) United States Patent
Qian

(10) Patent No.: US 9,117,900 B2
(45) Date of Patent: Aug. 25, 2015

(54) RF LDMOS DEVICE AND METHOD OF FORMING THE SAME

(71) Applicant: Shanghai Huahong Grace Semiconductor Manufacturing Corporation, Shanghai (CN)

(72) Inventor: Wensheng Qian, Shanghai (CN)

(73) Assignee: SHANGHAI HUAHONG GRACE SEMICONDUCTOR MANUFACTURING CORPORATION, Shanghai (CN)

( * ) Notice: Subject to any disclaimer, the term of this patent is extended or adjusted under 35 U.S.C. 154(b) by 0 days.

(21) Appl. No.: 14/147,484

(22) Filed: Jan. 3, 2014

(65) Prior Publication Data
US 2014/0191317 A1 Jul. 10, 2014

(30) Foreign Application Priority Data
Jan. 6, 2013 (CN) .......................... 2013 1 0003606

(51) Int. Cl.
*H01L 29/78* (2006.01)
*H01L 21/265* (2006.01)
*H01L 29/66* (2006.01)

(52) U.S. Cl.
CPC .......... *H01L 29/7816* (2013.01); *H01L 21/265* (2013.01); *H01L 29/66681* (2013.01)

(58) Field of Classification Search
CPC ............ H01L 29/7816; H01L 29/6659; H01L 29/66681
USPC .......................... 257/343, E29.012, E29.256
See application file for complete search history.

(56) References Cited

U.S. PATENT DOCUMENTS

| | | | |
|---|---|---|---|
| 2008/0237740 A1* | 10/2008 | Chen et al. ..................... | 257/391 |
| 2012/0043608 A1* | 2/2012 | Yang et al. ..................... | 257/336 |

* cited by examiner

*Primary Examiner* — Ha Tran T Nguyen
*Assistant Examiner* — Suberr Chi
(74) *Attorney, Agent, or Firm* — MKG LLC

(57) ABSTRACT

An RF LDMOS device is disclosed, including: a substrate having a first conductivity type; a channel doped region having the first conductivity type and a drift region having a second conductivity type, each in an upper portion of the substrate, the channel doped region having a first end in lateral contact with a first end of the drift region; a first well having the first conductivity type in the substrate, the first well having a top portion in contact with both of a bottom of the first end of the channel doped region and a bottom of the first end of the drift region; and a second well having the first conductivity type in the substrate, the second well having a top portion in contact with a bottom of a second end of the drift region. A method of forming such an RF LDMOS device is also disclosed.

13 Claims, 4 Drawing Sheets

RF LDMOS DEVICE AND METHOD OF FORMING THE SAME

CROSS-REFERENCE TO RELATED APPLICATION

This application claims the priority of Chinese patent application number 201310003606.6, filed on Jan. 6, 2013, the entire contents of which are incorporated herein by reference.

TECHNICAL FIELD

The present invention relates generally to semiconductor devices, and in particular, to a laterally diffused metal oxide semiconductor (LDMOS) device usable in radio frequency (RF) applications.

BACKGROUND

RF LDMOS devices are commonly used in high-power RF applications, such as RF base stations and RF broadcast stations. In general, RF LDMOS devices are used in plurality to form an array, in which each device is required to have substantial reliability in operation to avoid the whole array becoming useless upon unexpected failure (e.g., premature breakdown) of any susceptible RF LDMOS device.

FIG. 1 shows an existing RF LDMOS device, which can be either a P-channel or N-channel one. In the case of an N-channel RF LDMOS device, as illustrated in FIG. 1, the reference number 1 represents a heavily-doped P-type substrate whereon a lightly-doped P-type epitaxial layer 2 is formed. In the lightly-doped P-type epitaxial layer 2, there are sequentially formed a heavily-doped N-type source region 8, a P-type channel region 7 and an N-type drift region 3 in this order in a side-by-side manner, with a heavily-doped N-type drain region 9 formed in the N-type drift region 3. The P-type channel region 7 and the N-type drift region 3 are overlaid by a gate oxide layer 4 and a uniformly-doped polysilicon gate electrode 5 and stacked in the order from the bottom up. The polysilicon gate electrode 5 and a portion of the N-type drift region 3 are covered by a silicon oxide layer 10, and a portion of the silicon oxide layer 10 is further covered by a gate shield layer 11 which extends above at least a portion of the N-type drift region 3 while being isolated by the silicon oxide layer 10. A sinker region 12 extends downwards from a surface of the source region 8, through the source region 8 and the epitaxial layer 2, into the substrate 1.

With this design, in the event of a high voltage applied on the drain region 9, a snapback effect will be triggered, which is a predominant cause for burn-out of the RF LDMOS device. Accordingly, for the sake of reliability improvement, it is desirable to raise, as high as possible, the threshold of the drain voltage that can trigger the snapback effect. The threshold voltage can be increased by one or a combination of two or more of the following three measures: a) enhancing a breakdown voltage between the drain region 9 and the substrate 1; b) reducing the channel resistance of the device; and c) lowering a channel current upon the breakdown of the device. However, as for measure a), since the breakdown voltage is determined by dopant concentrations of the drain region 9 and the substrate 1, it is not adjustable as desired for a given design with predetermined dopant concentrations of the drain region 9 and the substrate 1.

SUMMARY OF THE INVENTION

Accordingly, it is an objective of the invention to provide an RF LDMOS device having an increased snapback effect triggering drain voltage threshold and hence a higher reliability. To this end, it is another objective of the invention to provide a method of forming such an RF LDMOS device.

In accordance with the above and further objectives of the invention, an RF LDMOS device includes: a substrate having a first conductivity type; a channel doped region having the first conductivity type and a drift region having a second conductivity type, each in an upper portion of the substrate, the channel doped region having a first end in lateral contact with a first end of the drift region; a first well having the first conductivity type in the substrate, the first well having a top portion in contact with both of a bottom of the first end of the channel doped region and a bottom of the first end of the drift region; and a second well having the first conductivity type in the substrate, the second well having a top portion in contact with a bottom of a second end of the drift region.

In a preferred embodiment, the top portion of the first well is spaced greater than 0.5 µm from top surfaces of the channel doped region and the drift region.

In a preferred embodiment, the top portion of the second well is spaced greater than 0.5 µm from a top surface of the drift region.

In a preferred embodiment, the first conductivity type is p-type and the second conductivity type is n-type.

In a preferred embodiment, the first conductivity type is n-type and the second conductivity type is p-type.

In accordance with the above and further objectives of the invention, a method of forming an RF LDMOS device includes: providing a substrate having a first conductivity type; and forming a channel doped region having the first conductivity type and a drift region having a second conductivity type, each in an upper portion of the substrate, and a first well having the first conductivity type and a second well having the first conductivity type, both in the substrate, such that: the channel doped region has a first end in lateral contact with a first end of the drift region; the first well has a top portion in contact with both of a bottom of the first end of the channel doped region and a bottom of the first end of the drift region; and the second well has a top portion in contact with a bottom of a second end of the drift region.

In a preferred embodiment, forming a channel doped region having the first conductivity type and a drift region having a second conductivity type, each in an upper portion of the substrate, and a first well having the first conductivity type and a second well having the first conductivity type, both in the substrate includes the steps of: forming a drift region having a second conductivity type in an upper portion of the substrate; forming a first well having the first conductivity type at a bottom of a first end of the drift region and forming a second well having the first conductivity type at a bottom of a second end of the drift region; and forming a channel doped region having the first conductivity type above the first well, the channel doped region having a first end in contact with the first end of the drift region and a bottom in contact with a portion of the top portion of the first well.

In a preferred embodiment, the first and second wells are each formed by an ion implantation process.

In a preferred embodiment, the ion implantation process includes one or more ion implantation steps.

In a preferred embodiment, the one or more ion implantation steps have a total ion dose of $1\times10^{12}$ atoms/cm$^2$ to $1\times10^{13}$ atoms/cm$^2$.

In a preferred embodiment, the channel doped region is formed by a tilted ion implantation process.

The design of further arranging the first well under the channel region and the second well under the drain region provides the RF LDMOS device of the invention with the following advantages.

Firstly, the first well can form a low-resistance channel under the channel doped region, which is capable of effectively reducing the total channel resistance and inhibiting the occurrence of snapback effect, while not affecting other characteristics of the RF LDMOS device.

Secondly, dopant ions can laterally diffuse from the first well into an area under a first end of the drift region, resulting in improvement of electric field uniformity in the drift region. Moreover, the dopant ions can further create a Reduced SURfsce Field (RESURF) effect in the drift region, which can improve the breakdown resistance of the drift region and hence further ensure that it is merely the voltage applied at the drain terminal that can cause the breakdown of the RF LDMOS device.

Lastly, the second well is capable of lowering the breakdown voltage between the drain terminal and the substrate to ensure, in the event of breakdown of the RF LDMOS device, most part of the drain current to flow towards the substrate rather than the channel, thereby raising the drain voltage threshold for triggering the snapback effect.

DETAILED DESCRIPTION

Figure 1:
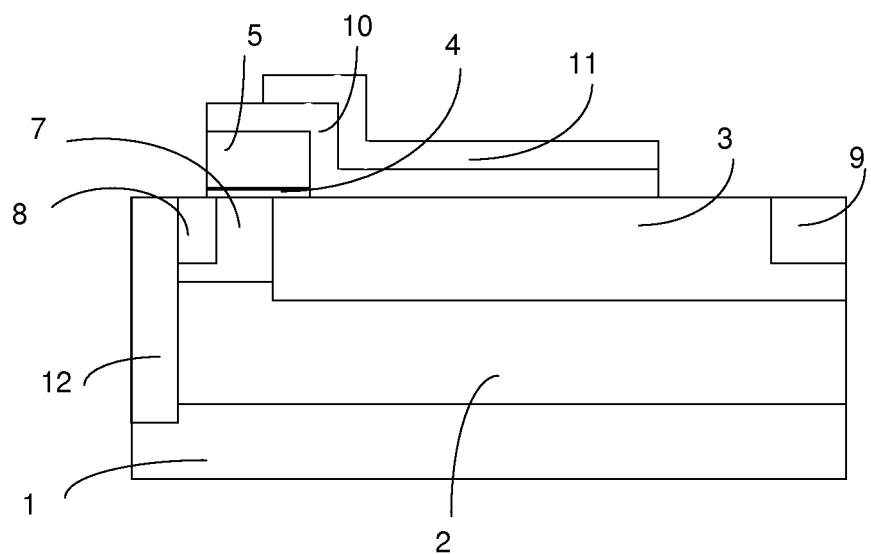
FIG. 1 is a schematic illustration of an RF LDMOS device of the prior art.
Figure 2A:
FIGS. 2a to 2h schematically illustrate a method of forming an RF LDMOS device in accordance with the present invention.
Figure 2B:
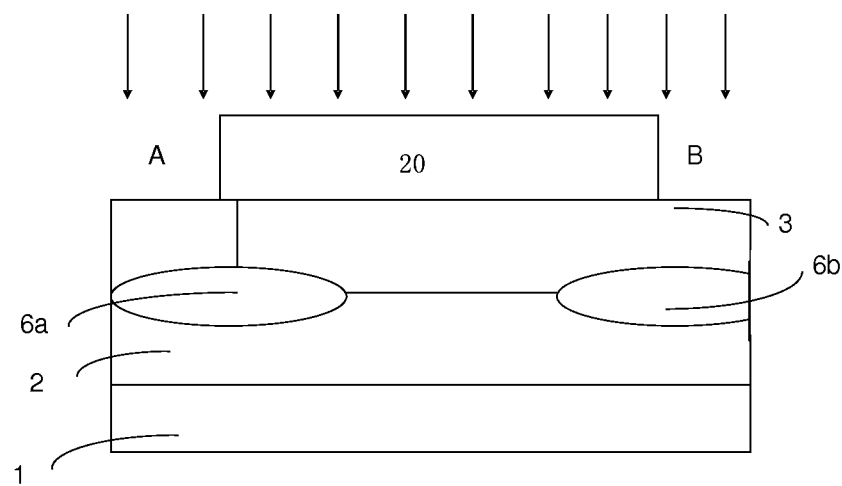
Figure 2C:
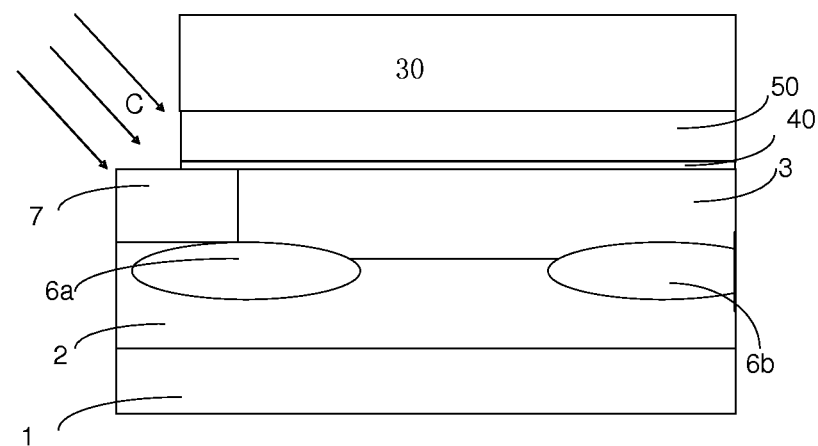
Figure 2D:
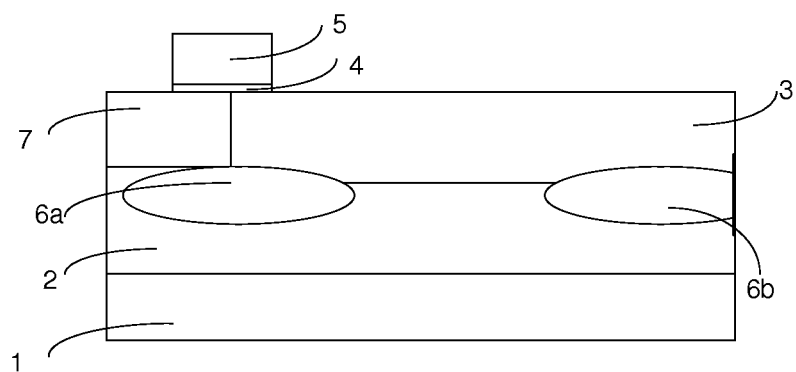
Figure 2E:
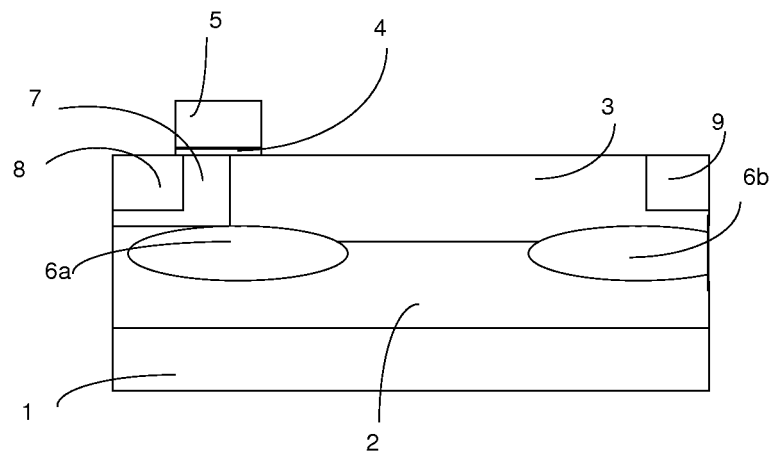
Figure 2F:
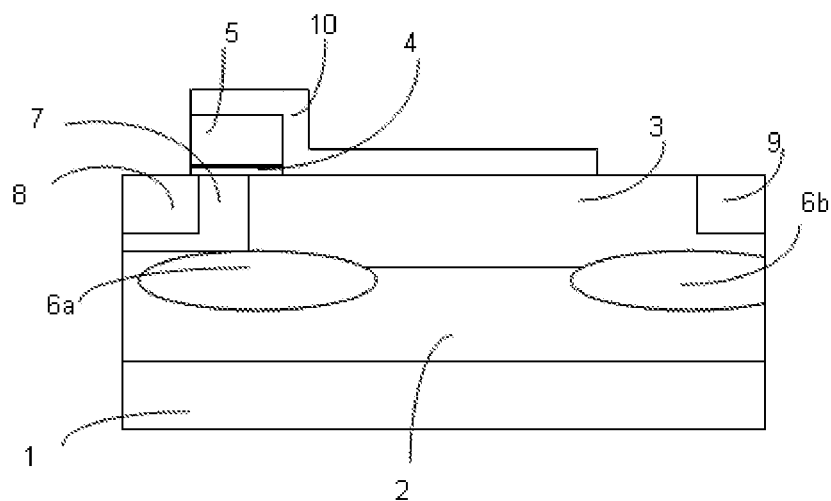
Figure 2G:
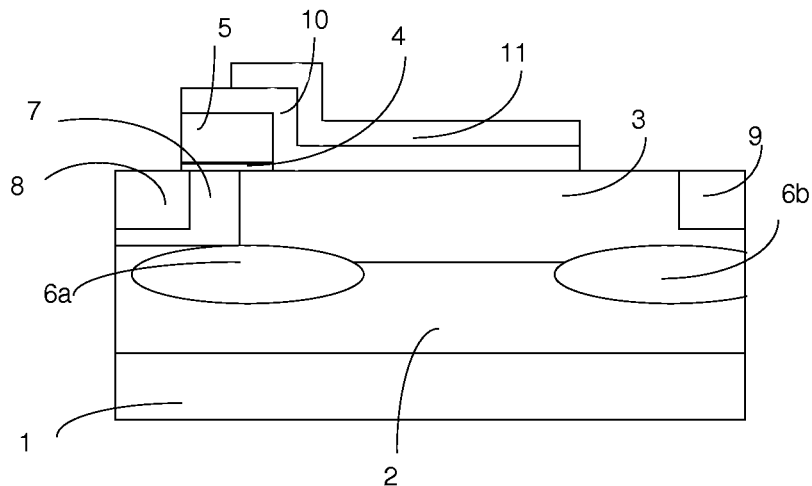
Figure 2H:
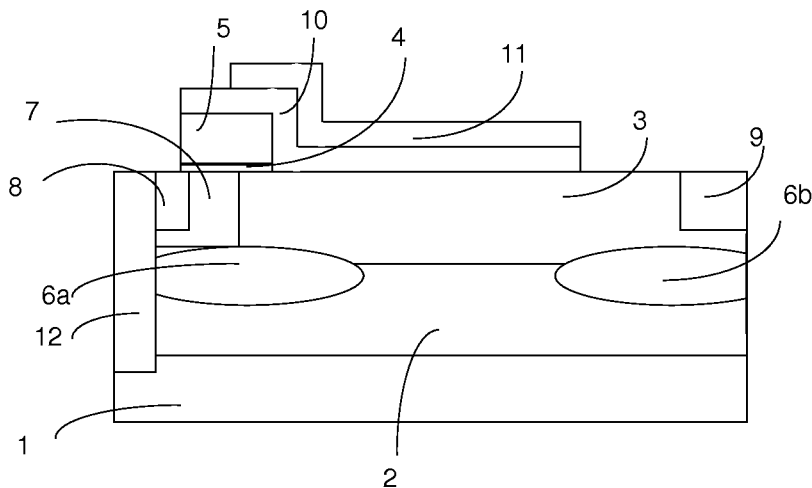

FIG. 2h is a schematic illustration of a radio frequency (RF) laterally diffused metal oxide semiconductor (LDMOS) device constructed in accordance with the present invention, which may be either a p-channel device or an n-channel device. In some embodiments, as illustrate in FIG. 2h, the RF LDMOS device is an N-channel device including a heavily-doped p-type substrate 1 and a lightly-doped p-type epitaxial layer 2 formed on the substrate 1. In the epitaxial layer 2, there are formed: a p-type channel region 7 and an n-type drift region 3, in contact with each other side by side; and a first p-type well 6a and a second p-type well 6b, independent from each other. The first well 6a underlies and contacts both of the channel region 7 and the drift region 3 at where the two regions come in contact. The second well 6b is under and in contact with an end of the drift region 3 away from the channel region 7. A heavily-doped n-type region acting as a source region 8 is formed in the channel region 7 and another heavily-doped n-type region acting as a drain region 9 is formed in the drift region 3. The channel region 7 and a portion of the drift region 3 are covered by a gate oxide layer 4 underlying a polysilicon gate 5. The whole polysilicon gate 5 and a portion of the drift region 3 are covered by a silicon oxide layer 10, and a portion of the silicon oxide layer 10 is further covered by a G-shield 11 which at least partially extends over the drift region 3 while being spaced apart therefrom by the silicon oxide layer 10. The device further includes a sinker region 12 extending downward from the surface of the source region 8, through the source region 8, the channel region 7 and the epitaxial layer 2, into the substrate 1. The polysilicon gate 5, the G-shield 11 and the drain region 9 are each covered by a metal silicide connected to external circuits (not shown), while the source region 8 and the sinker region 12 may be connected to external circuits either individually by a metal silicide or together by a metal disposed on the backside of the substrate 1.

As a variant, the N-channel RF LDMOS device may not include the epitaxial layer 2, and instead of that, other components of the device are directly formed in or on the substrate 1 accordingly.

In other embodiments, the RF LDMOS device of the present invention is a P-channel device which has a similar structure as the above described N-channel RF LDMOS device, but with components each opposite in conductivity type to those of the N-channel device.

The novelty of the present invention lies primarily in further incorporating, on the basis of the conventional RF LDMOS device, a first p-type well under the channel region and a second p-type well under the drain region. Advantageously, the first p-type well can effectively reduce the channel resistance of the device, and the second p-type well is capable of lowering the breakdown voltage between the drain terminal and the substrate to ensure, in the event of breakdown of the device, most part of the drain current to flow towards the substrate rather than the channel, thereby raising the drain voltage threshold for triggering the snapback.

The present invention also provides a method of forming an RF LDMOS device. In some specific embodiments, the method includes the following eight steps for forming an n-channel RF LDMOS device.

In a first step of the method, as shown in FIG. 2a, a lightly-doped p-type epitaxial layer 2 is first formed over a heavily-doped p-type substrate 1, and an ion implantation process including one or more ion implantation steps using photoresist (not shown) as a mask is performed to form an n-type drift region 3 in an upper portion of the epitaxial layer 2. The drift region 3 extends, in the epitaxial layer 2, laterally from an internal location to a terminal end. That is, a first end of the drift region 3 is near an internal location of the epitaxial layer 2 and a second end of the drift region 3 is near or coincides with the terminal end of the epitaxial layer 2.

Alternatively, in this step, the formation of the epitaxial layer 2 may be omitted, and the drift region 3 and the other components described below can accordingly be formed directly in or on the substrate 1 instead.

In a second step of the method, as shown in FIG. 2b, photoresist 20 is first coated over the epitaxial layer 2 and a photolithography process is then performed to form openings A and B in the photoresist 20. The opening B exposes a portion of the drift region 3, which extends inwardly a certain distance from the aforementioned terminal end of the epitaxial layer 2, whilst the opening A at least exposes the other terminal end of the epitaxial layer 2. As variants, the opening A may expose the portion of the epitaxial layer 2 near the other terminal end thereof and unoccupied by the drift region 3, or even may further expose the first end of the drift region 3. Subsequently, p-type dopant ions are implanted simultaneously through the openings A and B into the epitaxial layer 2 and into the drift region 3, respectively, to form, in the epitaxial layer 2, a first p-type well 6a under the opening A and a second p-type well 6b under the opening B. The top portion of the first well 6a is in contact with a bottom of the first end of the drift region 3. The top portion of the second well 6b is in contact with a bottom of the second end of the drift region 3. Alternatively, the first and second wells 6a and 6b may each partially extend upward into the lower portion of the drift region 3. After the first and second wells 6a and 6b are formed, the photoresist 20 is removed.

The implantation of p-type dopant ions may be accomplished in one or more steps, with a total ion dose of $1\times10^{12}$ atoms/cm$^2$ to 1×10$^{13}$ atoms/cm$^2$, so as to ensure a distance of greater than 0.5 μm, both between top surfaces of the first well 6a and the epitaxial layer 2, and between top surfaces of the second well 6b and the drift region 3.

In a third step of the method, as shown in FIG. 2c, a thermal oxidation process is first performed to grow silicon oxide 40 on surfaces of the epitaxial layer 2 and the drift region 3, followed by the deposition of polysilicon 50 over the silicon oxide 40 and the coating of photoresist 30 on the polysilicon 50. An opening C through the photoresist 30, the polysilicon 50 and the silicon oxide 40 is then formed using photolithography and etching processes. The opening C exposes a portion of the top surface of the epitaxial layer 2, which extends inwardly a certain distance from the aforementioned other end of the epitaxial layer 2, with the whole drift region 3 and the remainder portion of the epitaxial layer 2 still being covered by the remainders of the photoresist 30, the polysilicon 50 and the silicon oxide 40. Afterward, p-type dopant ions, preferably boron ions, are implanted through the opening C into the epitaxial layer 2 to form therein a channel doped region 7 in lateral contact with the drift region 3 and in vertical contact with the top portion of the first well 6a. In this step, the reminder of the photoresist 30 is retained throughout the ion implantation process to make it contribute to blocking ions from being implanted to undesirable locations, and is removed after the process.

Preferably, the p-type dopant ions are implanted at a certain angle of inclination with respect to the surface exposed in the opening C to facilitate the channel doped region 7 to grow towards the space under the remainder of the silicon oxide 40 and to make lateral contact with the drift region 3.

In a fourth step of the method, as shown in FIG. 2d, photolithography and etching processes are used to shape the remainders of the polysilicon 50 and the silicon oxide 40 into a polysilicon gate 5 and a gate oxide layer 4, respectively. As a result, the polysilicon gate 5 has its one end overlying the channel doped region 7 and the other end overlying the drift region 3, while the first well 6a is vertically right under the gate oxide layer 4 and spaced apart therefrom by portions of each of the channel doped region 7 and the drift region 3.

In a fifth step of the method, as shown in FIG. 2e, conventional source/drain implantation processes are used to form an n-type source region 8 in the channel doped region 7 and an n-type drain region 9 in the drift region 3. The source region 8 is located on a side of the gate oxide layer 4 away from the drift region 3, while the drain region 9 is in an end portion of the drift region 3 away from the gate oxide layer 4. As a result, the channel doped region 7 is reduced to a structure consisting of a major portion underlying the gate oxide layer 4 and a minor portion underlying the n-type source region 8, while the drain region 9 is right above the second well 6b and is spaced apart therefrom by a corresponding portion of the drift region 3.

In a sixth step of the method, as shown in FIG. 2f, a silicon oxide layer 10 is deposited over the surface of the whole structure resulting from the fifth step, and is then trimmed, using photolithography and etching processes, to a continuous piece covering the whole of the polysilicon gate 5 and a portion of the drift region 3.

In a seventh step of the method, as shown in FIG. 2g, a metal layer 11 is deposited over the surface of the whole structure resulting from the sixth step, and is then trimmed, using photolithography and etching processes, to a G-shield 11 extending over at least a portion of the drift region 3 while being spaced apart therefrom by the silicon oxide layer 10.

Alternatively, the gate shield layer 11 may be formed from heavily-doped n-type polysilicon, either by first depositing non-doped polysilicon and then implanting n-type dopant therein, or by directly depositing heavily-doped n-type polysilicon using an in-situ doping process.

In an eighth step of the method (i.e., the last step), as shown in FIG. 2h, a deep hole that goes through the source region 8, the channel doped region 7 and the epitaxial layer 2 and into the substrate 1 is formed by photolithography and etching, and is then filled with a metal, preferably tungsten, to form a sinker region 12. As a variant, the deep hole may be replaced by a deep trench.

In other embodiments, the method is employed to fabricate a p-channel RF LDMOS device by forming similar components as those described in conjunction with the description of the eight steps, but each having an opposite conductivity type. For example, in these embodiments, a heavily-doped n-type substrate, optionally formed thereon with a lightly-doped n-type epitaxial layer is provided in the first step; in the second and third steps, n-type dopant ions, with phosphorus or arsenic ions being preferred, are implanted; and in the fifth step, p-type dopant ions, preferably boron ions, are implanted.

It is to be understood that the preferred embodiments of the present invention presented in the foregoing description are not intended to limit the invention in any way. Those skilled in the art can make various alterations, modifications, and equivalent alternatives without departing from the scope of the invention. Thus, it is intended that the present invention covers all such alterations, modifications, and equivalent alternatives that fall within the true scope of the invention.

What is claimed is:

1. A radio frequency (RF) laterally diffused metal oxide semiconductor (LDMOS) device comprising:
    a substrate having a first conductivity type;
    a channel doped region having the first conductivity type and a drift region having a second conductivity type, each in an upper portion of the substrate, the channel doped region having a first end in lateral contact with a first end of the drift region;
    a first well having the first conductivity type in the substrate, the first well having a first portion located under and in direct contact with a bottom of the first end of the channel doped region and a second portion located under and in direct contact with a bottom of the first end of the drift region; and
    a second well having the first conductivity type in the substrate, the second well being located under the drift region and having a top portion in direct contact with a bottom of a second end of the drift region.

2. The RF LDMOS device of claim 1, wherein the top portion of the first well is spaced greater than 0.5 μm from top surfaces of the channel doped region and the drift region.

3. The RF LDMOS device of claim 1, wherein the top portion of the second well is spaced greater than 0.5 μm from a top surface of the drift region.

4. The RF LDMOS device of claim 1, wherein the first conductivity type is p-type and the second conductivity type is n-type.

5. The RF LDMOS device of claim 1, wherein the first conductivity type is n-type and the second conductivity type is p-type.

6. A method of forming a radio frequency (RF) laterally diffused metal oxide semiconductor (LDMOS) device according to claim 1, the method, comprising:
    providing a substrate having a first conductivity type;
    forming a channel doped region having the first conductivity type and a drift region having a second conductivity type, each in an upper portion of the substrate, and a first well having the first conductivity type and a second well having the first conductivity type, both in the substrate, such that: the channel doped region has a first end in lateral contact with a first end of the drift region; the first well has a top portion in contact with both of a bottom of the first end of the channel doped region and a bottom of the first end of the drift region; and the second well has a top portion in contact with a bottom of a second end of the drift region.

7. The method of claim 6, wherein forming a channel doped region having the first conductivity type and a drift region having a second conductivity type, each in an upper portion of the substrate, and a first well having the first conductivity type and a second well having the first conductivity type, both in the substrate includes the steps of:

forming a drift region having a second conductivity type in an upper portion of the substrate;

forming a first well having the first conductivity type at a bottom of a first end of the drift region and forming a second well having the first conductivity type at a bottom of a second end of the drift region; and forming a channel doped region having the first conductivity type above the first well, the channel doped region having a first end in contact with the first end of the drift region and a bottom in contact with a portion of the top portion of the first well.

8. The method of claim 7, wherein the channel doped region is formed by a tilted ion implantation process.

9. The method of claim 7, wherein the first and second wells are each formed by an ion implantation process.

10. The method of claim 9, wherein the ion implantation process includes one or more ion implantation steps.

11. The method of claim 10, wherein one or more ion implantation steps have a total ion dose of $1\times10^{12}$ atoms/cm$^2$ to $1\times10^{13}$ atoms/cm$^2$.

12. The method of claim 6, wherein the first conductivity type is p-type and the second conductivity type is n-type.

13. The method of claim 6, wherein the first conductivity type is n-type and the second conductivity type is p-type.

* * * * *